(12) United States Patent
Liu et al.

(10) Patent No.: US 12,401,950 B2
(45) Date of Patent: Aug. 26, 2025

(54) ELECTROACOUSTIC TRANSDUCER, SPEAKER MODULE, AND ELECTRONIC DEVICE

(71) Applicant: Huawei Technologies Co., Ltd., Shenzhen (CN)

(72) Inventors: Jinhua Liu, Shenzhen (CN); Tao Yan, Xi'an (CN); Li Guo, Shanghai (CN); Chien Feng Yeh, Shenzhen (CN); Ligang Yu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 274 days.

(21) Appl. No.: 18/042,758

(22) PCT Filed: Aug. 12, 2021

(86) PCT No.: PCT/CN2021/112206
§ 371 (c)(1),
(2) Date: Feb. 23, 2023

(87) PCT Pub. No.: WO2022/042317
PCT Pub. Date: Mar. 3, 2022

(65) Prior Publication Data
US 2023/0328452 A1    Oct. 12, 2023

(30) Foreign Application Priority Data

Aug. 25, 2020 (CN) .......................... 202010866796.4
Nov. 10, 2020 (CN) .......................... 202011245180.1

(51) Int. Cl.
*H04R 9/06* (2006.01)
*H04R 9/02* (2006.01)
(Continued)

(52) U.S. Cl.
CPC ............... *H04R 9/06* (2013.01); *H04R 9/025* (2013.01); *H04R 9/046* (2013.01); *H05K 1/189* (2013.01); *H04R 2499/11* (2013.01)

(58) Field of Classification Search
CPC .......... H04R 9/063; H04R 9/06; H04R 1/026; H04R 1/227; H04R 9/025; H04R 31/006;
(Continued)

(56) References Cited

U.S. PATENT DOCUMENTS 9,813,821 B1    11/2017    Song et al.
2014/0079269 A1*  3/2014    Choi ..................... H04R 1/342
                                                            381/365
(Continued)

FOREIGN PATENT DOCUMENTS

CN      203608352 U     5/2014
CN      204929242 U    12/2015
(Continued)

*Primary Examiner* — Carolyn R Edwards
*Assistant Examiner* — Julie X Dang
(74) *Attorney, Agent, or Firm* — Slater Matsil, LLP

(57) ABSTRACT

This application provides an electroacoustic transducer and an electronic device, the electroacoustic transducer includes a central magnet, two side magnets, a lower electrode plate, a side electrode plate, a frame, a sound diaphragm, a voice coil, and two flexible circuit boards. The central magnet and the two side magnets are disposed on the lower electrode plate. The side electrode plate is disposed on a surface of the two side magnets which is opposite to the lower electrode plate. Two surfaces of the frame are respectively fixedly connected to the sound diaphragm and a surface of the side electrode plate which is opposite to the lower electrode plate. The voice coil is located inside the frame. The two flexible circuit boards are symmetrically distributed on a (Continued)

peripheral side of the voice coil, two ends of the flexible circuit board are respectively connected to the voice coil and the side electrode plate.

20 Claims, 9 Drawing Sheets

(51) Int. Cl.
*H04R 9/04* (2006.01)
*H05K 1/18* (2006.01)
(58) Field of Classification Search
CPC ............ H04R 2400/03; H04R 2400/07; H04R 1/025; H04R 9/045; H04R 7/127; H04R 3/00; H04R 7/18; H04R 2209/022; H04R 7/04; H04R 1/44; H04R 2400/11; H04R 9/043; H04R 1/023; H04R 1/06; H04R 9/046; H04R 9/027; H04R 2209/041; H04R 2499/11; H05K 1/189
USPC .......................................... 381/400–412, 420
See application file for complete search history.

(56) References Cited

U.S. PATENT DOCUMENTS

2015/0365767 A1* 12/2015 Wang ................ H04R 9/025
381/400
2019/0132670 A1 5/2019 Qin et al.

FOREIGN PATENT DOCUMENTS

| CN | 110166902 | A | 8/2019 |
| CN | 210093502 | U * | 2/2020 |

* cited by examiner

ELECTROACOUSTIC TRANSDUCER, SPEAKER MODULE, AND ELECTRONIC DEVICE

CROSS-REFERENCE TO RELATED APPLICATIONS

This application is a national stage of International Application No. PCT/CN2021/112206, filed on Aug. 12, 2021, which claims priority to Chinese Patent Application No. 202011245180.1, filed on Nov. 10, 2020, and Chinese Patent Application No. 202010866796.4, filed on Aug. 25, 2020. All of the aforementioned applications are hereby incorporated by reference in their entireties.

TECHNICAL FIELD

This application relates to the field of electronic device technologies, and in particular, to an electroacoustic transducer, a speaker module, and an electronic device.

BACKGROUND

A moving coil micro-speaker is an electroacoustic transducer, and is an audio assembly commonly used in a portable electronic device currently. As consumers require increasingly high sound quality of electronic devices, speakers usually need to be designed with larger amplitudes. The speaker includes a voice coil and a magnetic circuit assembly configured to drive the voice coil to vibrate. A driving capability of the magnetic circuit assembly directly affects an amplitude of the speaker, and the driving capability of the magnetic circuit assembly is determined by a size of a magnet disposed in the magnetic circuit assembly. In the conventional technology, a leakage hole is usually designed at a corner location of a speaker. Therefore, magnetic circuit avoidance needs to be performed at the corner location. Consequently, a size of a magnet is small relative to an overall size of the speaker, and a driving capability of a magnetic circuit assembly is further limited, which is not conducive to improving sensitivity of the speaker.

SUMMARY

This application provides an electroacoustic transducer, a speaker module, and an electronic device, to improve sensitivity of the electroacoustic transducer.

According to a first aspect, this application provides an electroacoustic transducer. The electroacoustic transducer includes a central magnet, two side magnets, a lower electrode plate, a side electrode plate, a frame, a sound diaphragm, a voice coil, and two flexible circuit boards. The central magnet is disposed on a surface of the lower electrode plate. The central magnet may be of a rectangular structure, and includes a first corner part and a second corner part. The first corner part and the second corner part are diagonally disposed. The two side magnets and the central magnet are disposed on the same surface of the lower electrode plate, the two side magnets are respectively located on outer peripheral sides of the first corner part and the second corner part, and the two side magnets are disposed centrosymmetrically. A first gap exists between the side magnet and the central magnet. The side electrode plate is disposed on a surface that is of the two side magnets and that is opposite to the lower electrode plate. One surface of the frame is fixedly connected to a surface that is of the side electrode plate and that is opposite to the lower electrode plate, and the other surface is fixedly connected to a periphery of the sound diaphragm, so that the side electrode plate and the sound diaphragm are fastened to each other. The voice coil is located inside the frame, and the voice coil may be of a rectangular ring structure. One end of the voice coil is fixedly connected to the sound diaphragm, and the other end may be inserted into the first gap, so that the voice coil can vibrate under an effect of a magnetic field generated by the central magnet and the side magnet during power-on. The two flexible circuit boards are symmetrically distributed on a peripheral side of the voice coil, one end of the flexible circuit board is fixedly connected to the voice coil, and the other end is fixedly connected to the side electrode plate.

Compared with a conventional solution in which a side magnet is arranged on a side surface of a central magnet, in the electroacoustic transducer in the foregoing solution, the two side magnets are disposed around the two diagonally arranged corner parts of the central magnet, so that a magnet loss on outer peripheral sides of the two corner parts can be filled, and an overall size of the magnet is increased. Therefore, magnetic induction intensity of the electroacoustic transducer can be effectively improved, and a driving capability of the electroacoustic transducer is improved, so that the electroacoustic transducer has better sensitivity.

During specific disposition, the central magnet and the two side magnets may be separately fastened to a top surface of the lower electrode plate by bonding, to reduce assembly difficulty.

In some possible implementation solutions, the electroacoustic transducer further includes a central electrode plate. The central electrode plate is disposed on a surface that is of the central magnet and that is opposite to the lower electrode plate. In this way, a complete magnetic circuit can be formed between the central magnet and the side magnet, to ensure force-bearing and vibration of the voice coil.

In some possible implementation solutions, the central magnet includes a first side surface, a second side surface, a third side surface, and a fourth side surface. The first side surface and the second side surface are adjacent to the first corner part, and the third side surface and the fourth side surface are adjacent to the second corner part. The side magnet includes a first branch and a second branch. The first branch and the second branch may be connected to form an L-shaped structure. During specific disposition, the first branch and the second branch of one of the two side magnets are respectively located on outer sides of the first side surface and the second side surface, and the first branch and the second branch of the other one of the two side magnets are respectively located on outer sides of the third side surface and the fourth side surface. The two side magnets are set to L-shaped structures, so that not only the magnet loss on the outer peripheral sides of the first corner part and the second corner part can be filled, but also a side magnet is disposed around each side of the central magnet. Therefore, a size of the magnet can be significantly increased, and the electroacoustic transducer can obtain better sensitivity.

In some possible implementation solutions, the central magnet further includes a third corner part and a fourth corner part that are diagonally disposed. The third corner part is connected between the first side surface and the fourth side surface, and the fourth corner part is connected between the second corner part and the third corner part. In this case, the first branch of one of the two side magnets extends between the first corner part and the third corner part, and the second branch of one of the two side magnets extends to an end that is of the second side surface and that is close to the fourth corner part. The first branch of the other one of the two side magnets extends between the second corner part and the fourth corner part, and the second branch of the other one of the two side magnets extends to an end that is of the fourth side surface and that is close to the third corner part, so that the size of the magnet can be further increased.

In some possible implementation solutions, the voice coil includes a third corner corresponding to the third corner part of the central magnet and a fourth corner corresponding to the fourth corner part of the central magnet. The two flexible circuit boards are respectively disposed on outer peripheral sides of the third corner and the fourth corner, one end of the flexible circuit board is fixedly connected to the voice coil, and the other end is fixedly connected to a surface that is of the side electrode plate and that faces the lower electrode plate. In this solution, the two side magnets and the two flexible circuit boards are approximately disposed in a staggered manner. When peripheral space of the voice coil is fully utilized, force uniformity of the sound diaphragm can be further improved, so that a sound effect of the electroacoustic transducer can be improved.

When the flexible circuit board is specifically disposed, the flexible circuit board may include a first connection part, a second connection part, and a third connection part that are sequentially connected. The first connection part is fixedly connected to the voice coil, the second connection part is located on a side that is of the first connection part and that is away from the voice coil, the third connection part is located on a side that is of the second connection part and that is away from the first connection part, and the third connection part is fixedly connected to the side electrode plate. The side electrode plate is provided with a first notch and a second notch that are symmetrically distributed. The first notch may expose the first connection part and a part of the second connection part of one of the two flexible circuit board, and the second notch may expose the first connection part and a part of the second connection part of the other one of the two flexible circuit board, to provide avoidance space for movement of the flexible circuit board, and avoid interference between the flexible circuit board and the side electrode plate.

In some possible implementation solutions, on an outer peripheral side of the first side surface and an outer peripheral side of the third side surface, an end that is of the second connection part of the corresponding flexible circuit board and that is connected to the third connection part is stacked on the first branch, and an avoidance groove is disposed at a location that is on the first branch and that corresponds to an end part of the second connection part. By using this disposition, the avoidance groove may provide avoidance space for vibration of the second connection part in a direction facing the lower electrode plate, to avoid interference caused by the first branch to movement of the second connection part.

In addition, avoidance holes may also be respectively disposed at locations that are of the side electrode plate and that correspond to the two avoidance grooves. During specific disposition, the two avoidance holes may be connected to the first notch and the second notch respectively. In this way, the avoidance hole may provide avoidance space for vibration of the second connection part in a direction opposite to the lower electrode plate, to avoid interference caused by the side electrode plate to movement of the second connection part.

In some possible implementation solutions, the electroacoustic transducer may further include two auxiliary diaphragms. The two auxiliary diaphragms are respectively disposed on sides that are of the two flexible circuit boards and that face the sound diaphragms. One end of the auxiliary diaphragms may be fixedly connected to the first connection part of the corresponding flexible circuit board, and the other end may be fixedly connected to the third connection part of the corresponding flexible circuit board. In this way, when the sound diaphragm vibrates, the auxiliary diaphragm also vibrates synchronously driven by the flexible circuit board, so that rolling vibration of the voice coil can be suppressed, and the electroacoustic transducer can obtain better sound quality.

In some possible implementation solutions, the sound diaphragm includes a vibration part, a cross-sectional shape of the vibration part of the sound diaphragm is an arc shape, and the vibration part of the sound diaphragm protrudes in a direction opposite to the lower electrode plate. The auxiliary diaphragm also includes a vibration part, a cross-sectional shape of the vibration part of the auxiliary diaphragm is an arc, and the vibration part of the auxiliary diaphragm protrudes in a direction facing the lower electrode plate. In other words, the vibration part of the sound diaphragm and the vibration part of the auxiliary diaphragm protrude in different directions, to release space below the sound diaphragm, and allow the central magnet and the side magnet below the sound diaphragm to be set with a larger height. Therefore, magnetic induction intensity of the electroacoustic transducer is improved, and sensitivity of the electroacoustic transducer is improved.

In some possible implementation solutions, a third notch and a fourth notch may be respectively disposed at locations that are of the lower electrode plate and that correspond to the two auxiliary diaphragms, to provide avoidance space for vibration of the auxiliary diaphragm in a direction facing the lower electrode plate, and avoid interference caused by the lower electrode plate to movement of the auxiliary diaphragm.

In some possible implementation solutions, the electroacoustic transducer may further include a connection frame. The connection frame is located between the voice coil and the sound diaphragm. One end of the connection frame is fixedly connected to the voice coil, and the other end is fixedly connected to the sound diaphragm. The connection frame may be disposed to separate the voice coil from the sound diaphragm, so that the sound diaphragm is away from the voice coil. In addition, the connection frame may further perform heat dissipation for the voice coil, thereby reducing a risk of damaging the sound diaphragm due to overheating of the voice coil.

According to a second aspect, this application further provides a speaker module. The speaker module includes a box and the electroacoustic transducer in any one of the foregoing possible implementation solutions. The electroacoustic transducer is disposed in the box, and the box is provided with a sound outlet hole connecting an inner side of the box to an outer side of the box, so that a sound emitted by the electroacoustic transducer can be transmitted to the outer side of the box through the sound outlet hole. Because a driving capability of the magnet of the electroacoustic transducer is improved, the speaker module has high sensitivity.

According to a third aspect, this application further provides an electronic device. The electronic device includes a housing and the speaker module in the foregoing implementation solutions. The speaker module is disposed in the housing, a speaker hole is disposed on the housing, and the speaker hole connects the sound outlet hole to an outer side of the electronic device, so that a sound emitted by an electroacoustic transducer can be transmitted to the outer side of the electronic device through the sound outlet hole and the speaker hole. Because the speaker module has high sensitivity, sound quality of the electronic device is also improved.

According to a fourth aspect, this application further provides an electronic device. The electronic device includes a housing, a display module, and a receiver. The receiver is disposed in the housing, and the receiver may be the electroacoustic transducer in the foregoing implementation solutions. The display module includes a glass cover and a display panel. The glass cover is fastened to a side of the housing, and the display panel is fastened to an inner surface that is of the glass cover and that faces the housing. The electronic device is provided with a receiver hole, so that a sound emitted by the receiver can be transmitted to an outer side of the electronic device through the receiver hole. During specific disposition, the receiver hole may be disposed on the cover, or the receiver hole may be formed between an edge of the cover and the housing, or the receiver hole may be disposed on the housing. Because the speaker module has high sensitivity, sound quality of the electronic device is also improved.

REFERENCE NUMERALS

Figure 1:
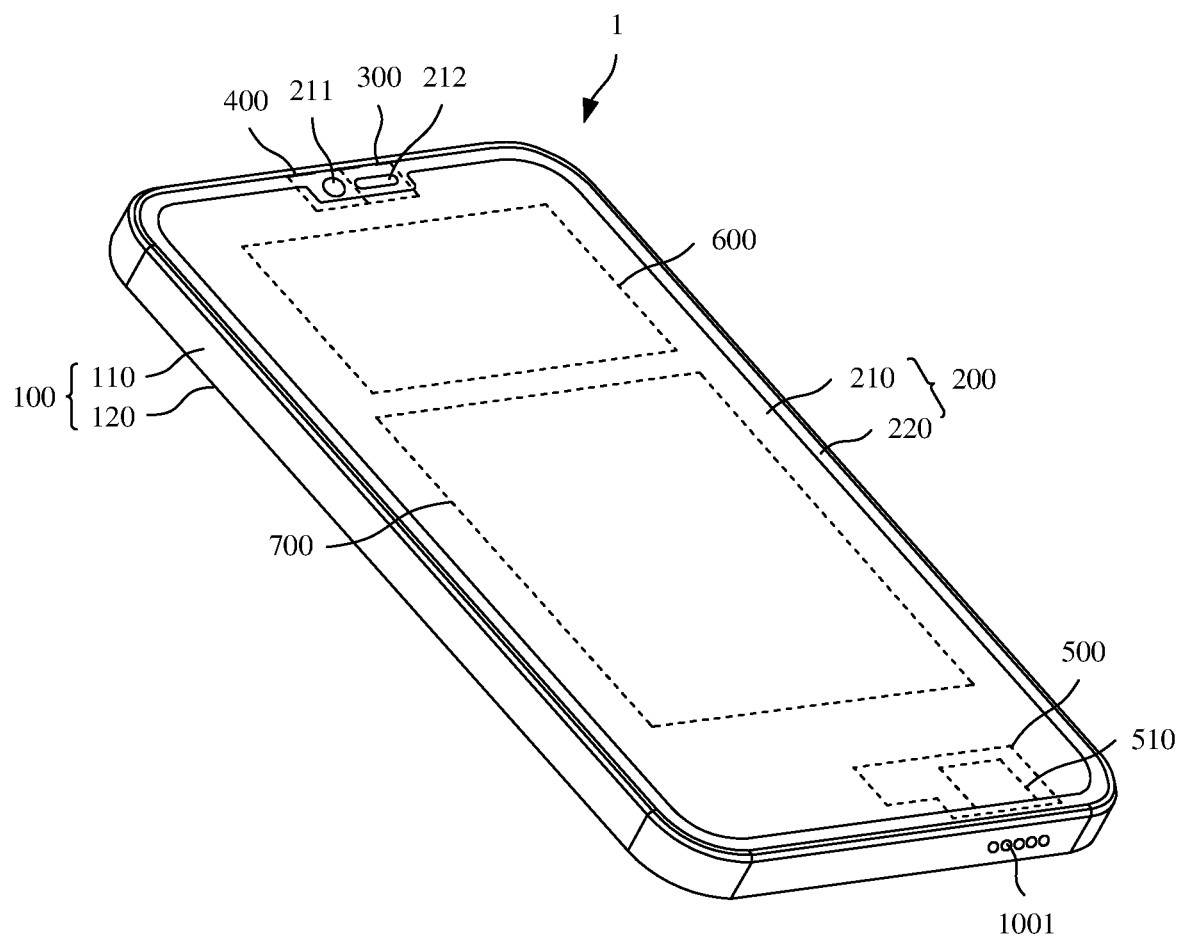
FIG. 1 is a schematic diagram of a structure of an electronic device 1 according to an embodiment of this application.

1—Electronic device; 100—Housing; 200—Display module; 300—Receiver; 400—Camera module; 500—Speaker module; 600—Mainboard; 700—Battery; 110—Middle frame; 120—Rear cover; 1001—Speaker hole; 210—Glass cover; 220—Display panel; 211—Light transmission region; 212—Receiver hole; 510—Electroacoustic transducer; 520—Box; 530—Cover body; 540—Circuit board; 521—Sound outlet hole; 522—Slot; 523—Protrusion; 10—Frame; 20—Vibration assembly; 30—Magnetic circuit assembly; 21—Sound diaphragm; 22—Connection frame; 23—Voice coil; 24, 24a, 24b—Flexible circuit board; 25—Auxiliary diaphragm; 211—Diaphragm; 212—Dome; 213—First fastening part of the diaphragm; 214—Vibration part of the diaphragm; 215—Second fastening part of the diaphragm; 221—Body; 222—Extension part; 241—First connection part; 242—Second connection part; 243—Third connection part; 2411—Arc segment of the first connection part; 2412—Straight line segment of the first connection part; 2421—Arc segment of the second connection part; 2422—Straight line segment of the second connection part; 251—First fastening part of the auxiliary diaphragm; 252—Vibration part of the auxiliary diaphragm; 253—Second fastening part of the auxiliary diaphragm; 31—Central electrode plate; 32—Side electrode plate; 33—Central magnet; 34, 34a, 34b—Side magnet; 35—Lower electrode plate; 36—First gap; 341—First branch; 342—Second branch; 331—First side surface; 332—Second side surface; 333—Third side surface; 334—Fourth side surface; 37—Connection space; 38—Second gap; 321—First notch; 322—Second notch; 351—Third notch; 352—Fourth notch; 343—First avoidance groove; 323—Second avoidance groove; 344—Third avoidance groove; 324—Fourth avoidance groove.

DETAILED DESCRIPTION OF ILLUSTRATIVE EMBODIMENTS

The following clearly and completely describes the technical solutions in the implementations of this application with reference to the accompanying drawings in the implementations of this application.

An embodiment of this application provides an electroacoustic transducer. The electroacoustic transducer is configured to convert an electrical signal into a sound signal. In the electroacoustic transducer, structures and relative locations of a magnetic circuit assembly and a flexible circuit board are optimized. Therefore, an area and a volume of a magnet are increased, and a driving capability of the magnetic circuit assembly can be improved, so that the electroacoustic transducer has better sensitivity. An embodiment of this application further provides an electronic device including the electroacoustic transducer. The electronic device may be a product with a sound play function, for example, a mobile phone, a tablet computer, a notebook computer, a wearable device, or a personal stereo. The wearable device may be a smart band, a smart watch, a smart head-mounted display device, smart glasses, or the like. For example, the electroacoustic transducer may be used for the electronic device as a speaker core of a speaker module (also referred to as a loudspeaker), or may be used for the electronic device as a receiver (also referred to as an earpiece).

FIG. 1 is a schematic diagram of a structure of an electronic device 1 according to an embodiment of this application. The electronic device 1 shown in FIG. 1 is described by using a mobile phone as an example. The electronic device includes a housing 100, a display module 200, a receiver 300, a camera module 400, a speaker module 500, a mainboard 600, and a battery 700. It should be noted that FIG. 1 and the following related accompanying drawings merely schematically show some components included in the electronic device 1. Actual shapes, actual sizes, actual locations, and actual structures of these components are not limited by FIG. 1 and the following accompanying drawings.

The housing 100 includes a middle frame 110 and a rear cover 120. The rear cover 120 is fastened to a side of the middle frame 110. In an implementation, the rear cover 120 may be fastened to the middle frame 110 by assembling. In another implementation, the rear cover 120 and the middle frame 110 may alternatively be of an integrated structure. A speaker hole 1001 is disposed on the housing 100, and there may be one or more speaker holes 1001. For example, there are a plurality of speaker holes 1001, and the plurality of speaker holes 1001 are disposed on the middle frame 110. The speaker hole 1001 may connect an inner side of the electronic device 1 to an outer side of the electronic device 1.

The display module 200 is fastened to a side that is of the middle frame 110 and that is away from the rear cover. In this case, the display module 200 and the rear cover 120 are disposed opposite to each other, and the display module 200, the middle frame 110, and the rear cover 120 jointly form the inner side of the electronic device 1. The display module 200 includes a glass cover 210 and a display panel 220. The glass cover 210 is stacked on a side that is of the display panel 220 and that is away from the middle frame 110. The display panel 220 is configured to display an image, and the display panel 220 may further be integrated with a touch function. The glass cover 210 may be disposed against the display panel 220, and is mainly configured to protect the display panel 220 and prevent against dust. A light transmission region 211 and a receiver hole 212 are disposed on the glass cover 210. The light transmission region 211 may allow light to pass through. For example, an ink layer of the glass cover 210 is hollowed out in a region in which the light transmission region 211 is located. The receiver hole 212 is a through hole penetrating the glass cover 210.

In some other embodiments, a receiver hole is formed between an edge of the glass cover 210 and the housing 100. For example, the receiver hole is formed between an edge, at the top of the electronic device 1, of the glass cover 210 and an edge, at the top of the electronic device 1, of the middle frame 110 of the housing 100. In some other embodiments, a receiver hole is disposed on the housing 100. For example, a receiver hole is formed in a region, at the top of the electronic device 1, of the middle frame 110 of the housing 100. A specific formation structure and location of the receiver hole are not strictly limited in this application.

The receiver 300 is disposed in the housing 100. The receiver 300 is located between the display module 200 and the rear cover 120. A sound emitted by the receiver 300 is transmitted to the outer side of the electronic device 1 through the receiver hole 212, to implement a sound play function of the electronic device 1. For example, the receiver 300 may be an electroacoustic transducer described in the following embodiments. In another embodiment, the receiver 300 may be alternatively an electroacoustic transducer with another structure.

The camera module 400 is accommodated in the housing 100. The camera module 400 is located between the display module 200 and the rear cover 120. The camera module 400 collects light through the light transmission region of the glass cover 210, to perform photographing. The electronic device 1 may further include another camera module accommodated in the housing 100. A photographing through hole may be disposed on the rear cover 120. The another camera module may collect light through the photographing through hole, to perform photographing.

The speaker module 500 is accommodated in the housing 100. The speaker module 500 is located between the display module 200 and the rear cover 120. A sound emitted by the speaker module 500 can be transmitted to the outer side of the electronic device 1 through the speaker hole 1001, to implement the sound play function of the electronic device 1. The speaker module 500 includes a speaker core. The speaker core may be the electroacoustic transducer 510 described in the following embodiments. In another embodiment, the speaker core may be alternatively an electroacoustic transducer with another structure.

Both the mainboard 600 and the battery 700 are accommodated in the housing 100. The mainboard 600 is located on one side of the battery 700. For example, the mainboard 600 is located on an upper part of the electronic device 1, and the battery 700 is located on a lower part of the electronic device 1. The battery 700 is configured to supply power to the electronic device 1. The mainboard 600 may be a rigid mainboard, or may be a flexible mainboard, or may be a combination of a rigid mainboard and a flexible mainboard. In addition, the mainboard 600 may be configured to set a chip. The chip may be a central processing unit (central processing unit, CPU for short), a graphics processing unit (graphics processing unit, GPU for short), a universal flash storage (universal flash storage, UFS for short), or the like. Functional modules of the electronic device 1, for example, the display module 200, the camera module 400, the speaker module 500, and the receiver 300, are coupled to the CPU.

Figure 2:
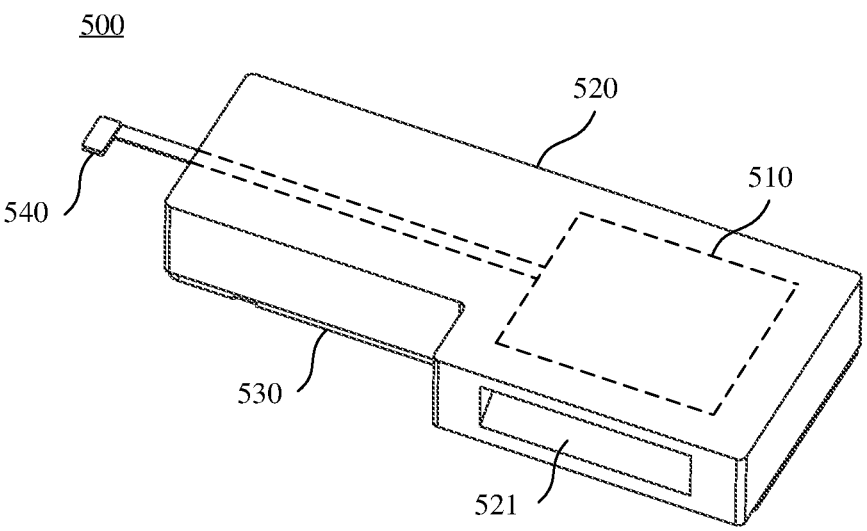
FIG. 2 is a schematic diagram of a structure of a speaker module of the electronic device shown in FIG. 1.
Figure 3:
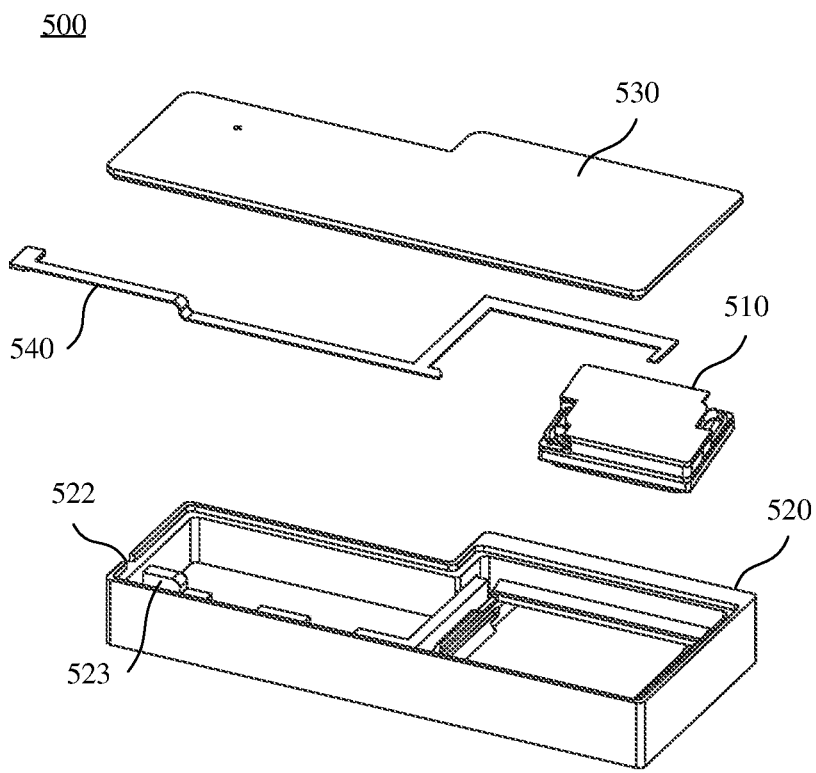
FIG. 3 is a schematic exploded view of the speaker module shown in FIG. 2.

Refer to FIG. 2 and FIG. 3. FIG. 2 is a schematic diagram of a structure of a speaker module of the electronic device shown in FIG. 1. FIG. 3 is a schematic exploded view of the speaker module shown in FIG. 2.

The speaker module 500 includes an electroacoustic transducer 510, a box 520, a cover body 530, and a circuit board 540. The cover body 530 is disposed on a side of the box 520, and the cover body 530 are fixedly connected to the box 520 to form a sound box. The electroacoustic transducer 510 is located inside the sound box. One end of the circuit board 540 is located inside the sound box, to connect to the electroacoustic transducer 510. The other end of the circuit board 540 is located outside the sound box, to electrically connect the electroacoustic transducer 510 to an external component of the speaker module 500. For example, the end that is of the circuit board 540 and that is located outside the sound box may be fixed and electrically connected to the mainboard.

A sound outlet hole 521 is disposed on a side surface of the box 520. The sound outlet hole 521 connects an inner side of the sound box to an outer side of the sound box. A sound emitted by the electroacoustic transducer 510 can be transmitted to the outer side of the sound box through the sound outlet hole 521. With reference to FIG. 1, the speaker hole 1001 of the housing 100 connects the sound outlet hole 521 of the speaker module 500 to the outer side of the electronic device 1. The sound emitted by the electroacoustic transducer 510 can be transmitted to the outer side of the electronic device 1 through the sound outlet hole 521 and the speaker hole 1001.

A slot 522 connecting the inner side of the sound box to the outer side of the sound box is further disposed at an end that is of the box 520 and that faces the cover body 530. The circuit board 540 may specifically extend to the outer side of the sound box through the slot 522. The circuit board 540 may be a flexible circuit board. During specific implementation, a protrusion 523 disposed in a direction facing the cover body 530 is disposed in the box 520. One end of the protrusion 523 is disposed close to the slot 522, and the other end is disposed close to the electroacoustic transducer 510. A part that is of the circuit board 540 and that is located in the sound box is disposed on an end face of the protrusion 523. In this way, the circuit board 540 can be firmly fixed in the sound box, to reduce a risk of damaging the circuit board 540 due to shaking. In addition, an end that is of the circuit board 540 and that is located in the sound box may include two branches. Ends of the two branches are respectively formed as two connection ends connected to the electroacoustic transducer 510.

Figure 4:
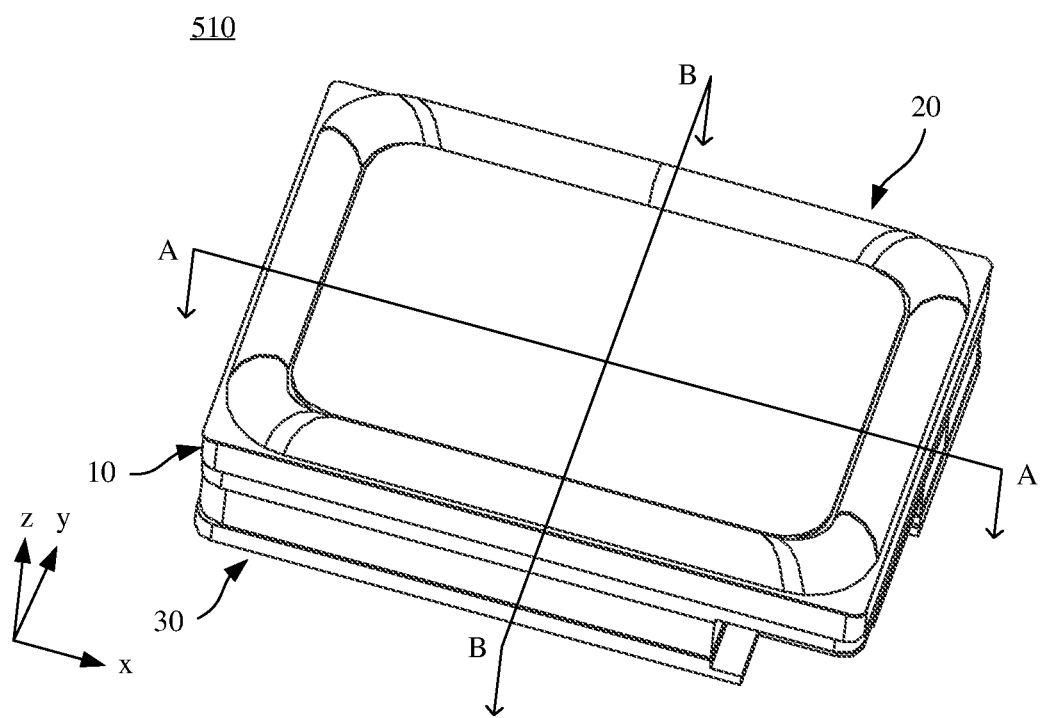
FIG. 4 is a schematic diagram of a structure of an electroacoustic transducer according to an embodiment of this application.
Figure 5:
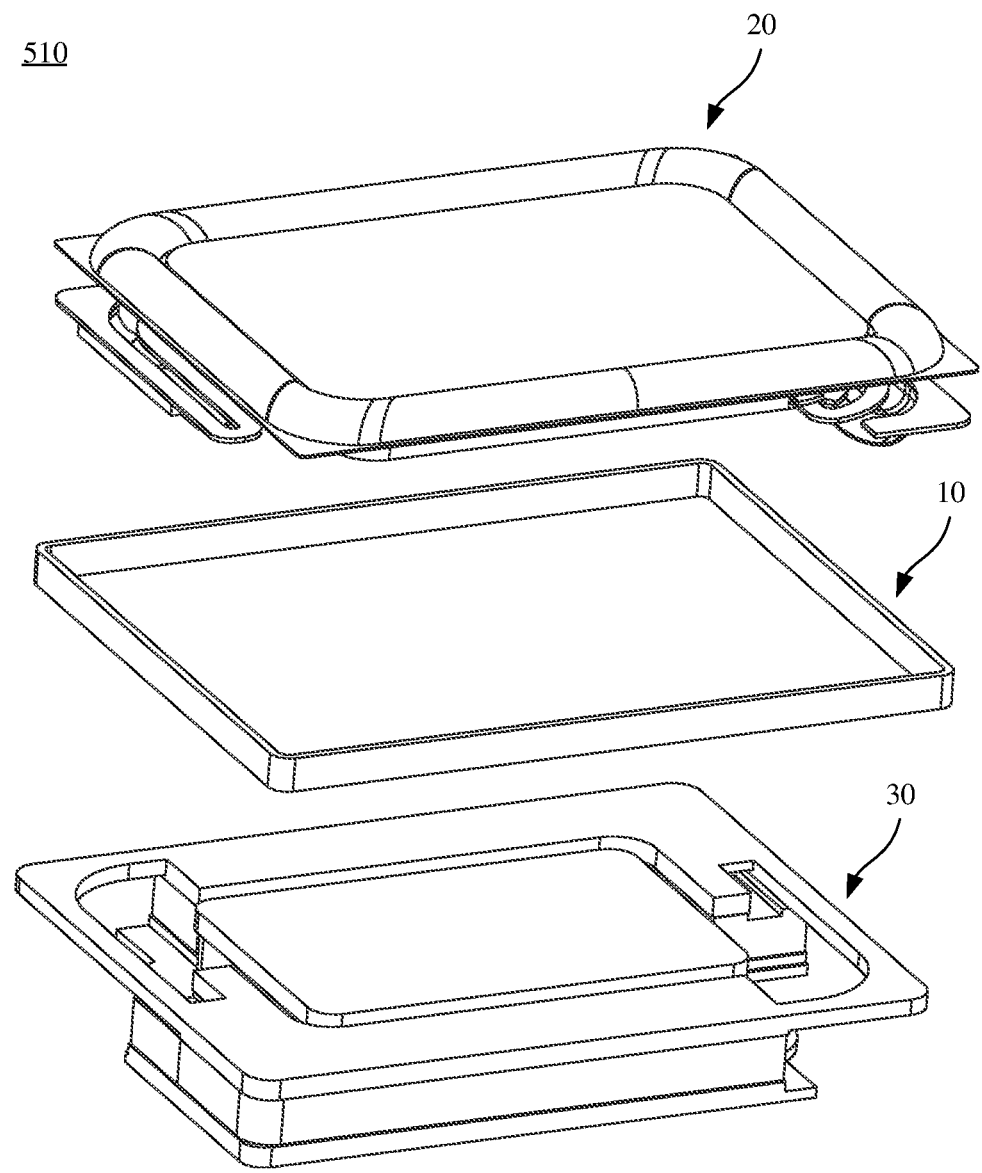
FIG. 5 is a partial schematic exploded view of the electroacoustic transducer shown in FIG. 4.

Refer to FIG. 4 and FIG. 5. FIG. 4 is a schematic diagram of a structure of an electroacoustic transducer according to an embodiment of this application. FIG. 5 is a partial schematic exploded view of the electroacoustic transducer shown in FIG. 4. In this embodiment of this application, an x direction is defined as a length direction of the electroacoustic transducer 510, a y direction is defined as a width direction of the electroacoustic transducer 510, and a Z direction is defined as a thickness direction of the electroacoustic transducer 510. It should be noted that orientation terms such as "top" and "bottom" used for the electroacoustic transducer 510 in this embodiment of this application are mainly intended for description based on a display orientation of the electroacoustic transducer 510 in FIG. 4, and do not limit an orientation of the electroacoustic transducer 510 in an actual application scenario.

The electroacoustic transducer 510 includes a frame 10, a vibration assembly 20, and a magnetic circuit assembly 30. The vibration assembly 20 and the magnetic circuit assembly 30 are mounted on the frame 10. A part that is of each component of the vibration assembly 20 and that is connected to the frame 10 is fixed relative to the frame 10, and a remaining part may vibrate relative to the frame 10. The magnetic circuit assembly 30 is fixed relative to the frame 10, and the magnetic circuit assembly 30 may be configured to provide a driving magnetic field for the vibration assembly 20.

Figure 6:
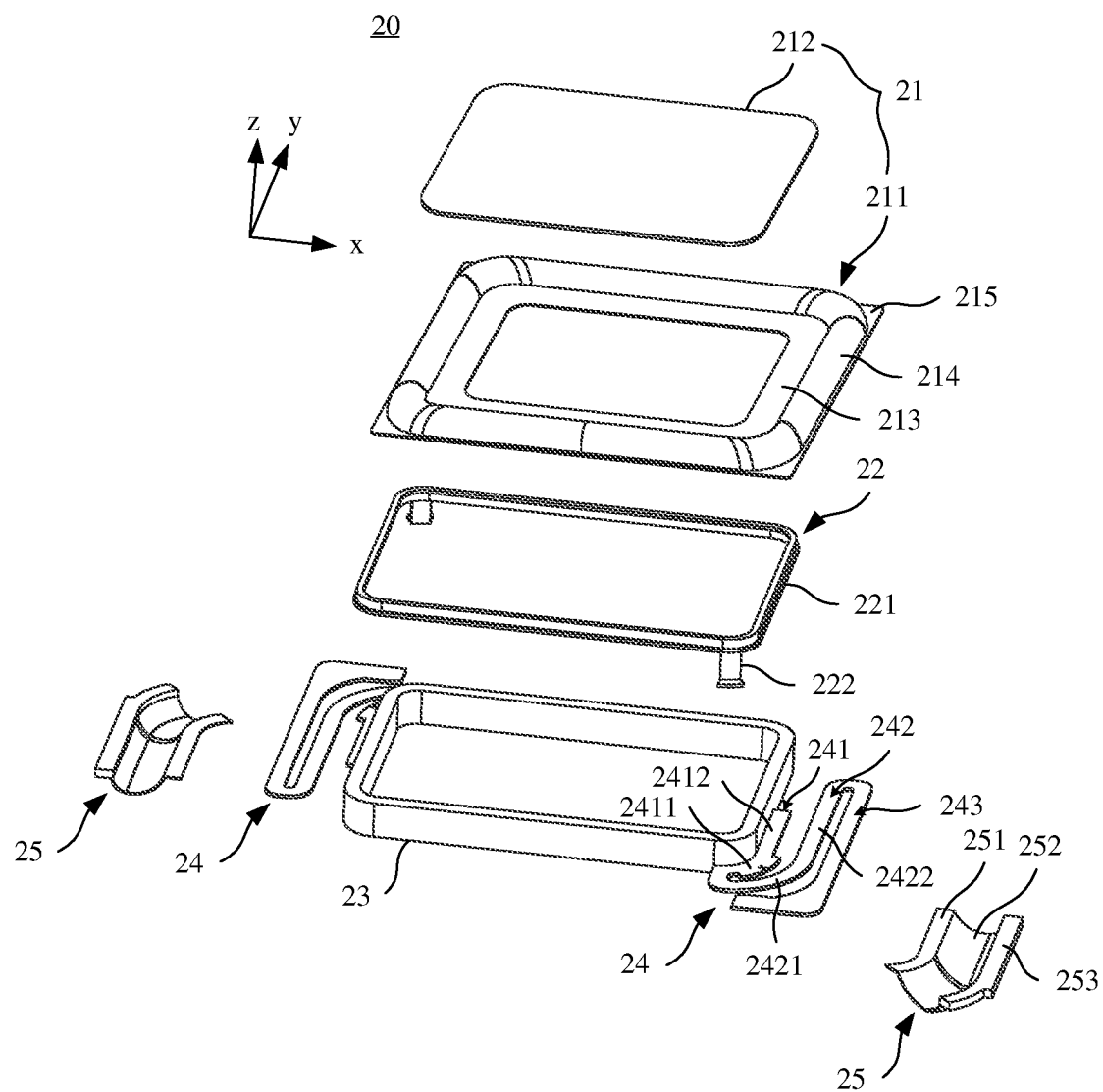
FIG. 6 is a partial schematic exploded view of a vibration assembly of the electroacoustic transducer shown in FIG. 4.

FIG. 6 is a partial schematic exploded view of a vibration assembly of the electroacoustic transducer shown in FIG. 4. The vibration assembly 20 of the electroacoustic transducer includes a sound diaphragm 21, a connection frame 22, a voice coil 23, two flexible circuit boards 24, and two auxiliary diaphragms 25. The voice coil 23 may be roughly of a rectangular ring structure. For example, the voice coil 23 may be in a rounded rectangular ring shape. The voice coil 23 includes four straight edges and four corner parts, and one corner part is connected between two adjacent straight edges. In this embodiment, the voice coil 23 is inserted into the magnetic circuit assembly. Under an effect of a magnetic field provided by the magnetic circuit assembly, when the voice coil 23 is powered on, an ampere force may be generated, to drive another component of the vibration assembly to vibrate.

The sound diaphragm 21 includes a diaphragm 211 and a dome 212. The diaphragm 211 is roughly in a rectangular ring shape, and includes a first fastening part 213, a vibration part 214, and a second fastening part 215. The first fastening part 213 is located inside the vibration part 214, and the second fastening part 215 is located outside the vibration part 214. The first fastening part 213 of the diaphragm 211 is fixedly connected to the dome 212, and the second fastening part 215 is fixedly connected to the frame. In addition, during specific disposition, the dome 212 is connected to a top surface of the first fastening part 213, and the frame is connected to a bottom surface of the second fastening part 215. A cross-sectional shape of the vibration part 214 of the diaphragm 211 is an arc or approximately arc shape, an extension track of the vibration part 214 is in a rounded rectangle shape, and the vibration part 214 is convex. To be specific, the vibration part 214 protrudes in a direction away from the voice coil 23. When the vibration part 214 is subject to an external force, the vibration part 214 can deform, so that the first fastening part 213 and the dome 212 move relative to the second fastening part 215.

The connection frame 22 may be configured to connect the voice coil 23 to the sound diaphragm 21. Specifically, the connection frame 22 includes a body 221 and an extension part 222. A shape of the body 221 is roughly a rectangular ring shape matching the voice coil 23. One end of the body 221 is connected to an end face on a side that is of the voice coil 23 and that faces the sound diaphragm 21, and the other end of the body 221 is connected to an end face of a side that is of the sound diaphragm 21 and that faces the voice coil 23. The extension part 222 is disposed at an end that is of the body 221 and that faces the voice coil 23. When the body 221 is fastened to the voice coil 23, the extension part 222 is attached to an outer peripheral surface of the voice coil 23. There may be one or more extension parts 222. For example, there are two extension parts 222 shown in FIG. 6, and the two extension parts 222 may be symmetrically disposed near two diagonals of the body 221. In this way, after the body 221 and the voice coil 23 are assembled, the two extension parts 222 may be respectively attached and fastened to outer peripheral surfaces of the two diagonally disposed corner parts of the voice coil 23. Therefore, when force uniformity of the voice coil 23 is ensured, connection strength between the connection frame 22 and the voice coil 23 can be improved. The connection frame 22 may be disposed to separate the voice coil 23 from the sound diaphragm 21, so that the sound diaphragm 21 is away from the voice coil 23. In addition, the connection frame 22 may further perform heat dissipation for the voice coil 23, thereby reducing a risk of damaging the sound diaphragm 21 due to overheating of the voice coil 23.

Refer to FIG. 6 again. Structures of the two flexible circuit boards 24 are the same, and the two flexible circuit boards 24 are centrosymmetrically disposed on the outer peripheral side of the voice coil 23. For example, the two flexible circuit boards 24 are separately disposed near the two diagonally disposed corner parts of the voice coil 23. Two ends of a lead of the voice coil 23 may be electrically connected to the two flexible circuit boards 24 respectively, and the two flexible circuit boards 24 are electrically connected to the foregoing circuit board, to implement electrical connection to an external component of the electroacoustic transducer. Alternatively, two ends of a lead of the voice coil 23 may be electrically connected to one of the two flexible circuit boards 24, and the flexible circuit board 24 is electrically connected to the foregoing circuit board, to implement electrical connection to an external component of the electroacoustic transducer.

During specific implementation, the flexible circuit board 24 includes a first connection part 241, a second connection part 242, and a third connection part 243. The second connection part 242 is connected between the first connection part 241 and the third connection part 243. The first connection part 241, the second connection part 242, and the third connection part 243 are roughly of strip-shaped structures. The first connection part 241 is connected to an outer peripheral surface of a corresponding corner part of the voice coil 23. In addition, to increase a contact area between the first connection part 241 and the voice coil 23, a head end of the first connection part 241 may extend to an outer side surface that is adjacent to the corresponding corner part on the voice coil 23 and that extends in a first direction (that is, the width direction y of the electroacoustic transducer). A head end of the second connection part 242 is connected to a tail end of the first connection part 241, the second connection part 242 is located on a side that is of the first connection part 241 and that is away from the voice coil 23, and the second connection part 242 and the first connection part 241 are disposed at an interval. A head end of the third connection part 243 is connected to a tail end of the second connection part 242, the third connection part 243 is located on a side that is of the second connection part 242 and that is away from the first connection part 241, and the third connection part 243 and the second connection part 242 are disposed at an interval. For example, a connection location between the first connection part 241 and the second connection part 242 is disposed roughly in a U shape, and a connection location between the second connection part 242 and the third connection part 243 is also disposed roughly in a U shape.

In addition, when the voice coil 23 is of a rounded rectangular structure, to better match a shape of the outer peripheral surface of the voice coil 23, the first connection part 241 and the second connection part 242 may separately include an arc segment and a straight line segment. A straight line segment 2412 of the first connection part 241 is disposed close to the head end of the first connection part 241, and an arc segment 2411 of the first connection part 241 is disposed close to the tail end of the first connection part 241. An arc segment 2421 of the second connection part 242 is disposed close to the head end of the second connection part 242, and a straight line segment 2422 of the second connection part 242 is disposed close to the tail end of the second connection part 242. The third connection part 243 is disposed roughly in an L shape, a corner location of the third connection part 243 is located on an outer side of the arc segment of the second connection part 242, and a corner of the third connection part 243 is a rounded corner. In this embodiment, the arc segment 2411 of the first connection part 241, the arc segment 2421 of the second connection part 242, and the corner of the third connection part 243 are all disposed coaxially with a corresponding corner part of the voice coil 23. It may be understood that, that two structures are coaxially disposed means that central axes (or referred to as center lines) of the two structures overlap, and a slight deviation caused by a manufacturing tolerance, an assembly tolerance, or the like is allowed.

In this embodiment, because the arc segment 2411 of the first connection part 241, the arc segment 2421 of the second connection part 242, and the corner of the third connection part 243 are coaxially disposed with the corresponding corner part of the voice coil 23, when the voice coil 23 drives the flexible circuit board 24 to vibrate, a shape of the flexible circuit board 24 can better adapt to deformation and displacement requirements, so that the flexible circuit board 24 has better reliability and a longer service life. In addition, by using this disposition, outside space of the corner part of the voice coil 23 can be fully used at each connection part, to route a longer wire, so that when the flexible circuit board 24 vibrates with the voice coil 23 at a large amplitude, stress is small, and the flexible circuit board 24 has higher reliability.

Figure 7:
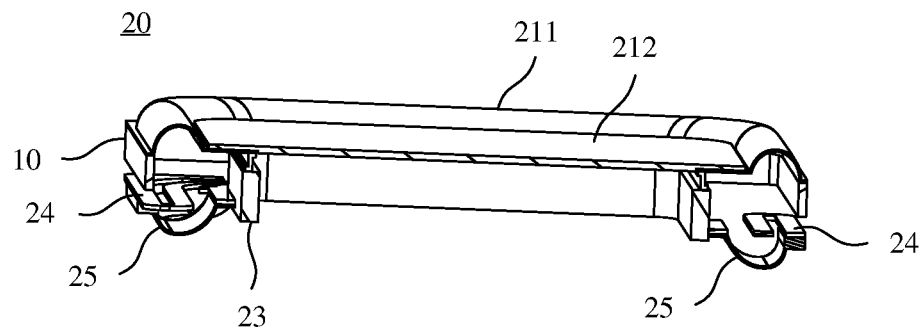
FIG. 7 is a sectional view of a vibration assembly of the electroacoustic transducer shown in FIG. 4 in an A-A direction.

FIG. 7 is a sectional view of a vibration assembly of the electroacoustic transducer shown in FIG. 4 in an A-A direction. Refer to FIG. 6 and FIG. 7. Structures of the two auxiliary diaphragms 25 are the same, and the two auxiliary diaphragms 25 are respectively disposed corresponding to the two flexible circuit boards 24. Specifically, the two auxiliary diaphragms 25 may be separately disposed on a side of a bottom surface of the corresponding flexible circuit board 24. The auxiliary diaphragm 25 includes a first fastening part 251, a vibration part 252, and a second fastening part 253. The first fastening part 251 is located inside the vibration part 252, and the second fastening part 253 is located outside the vibration part 252. An extension track of the auxiliary diaphragm 25 matches the track of the first connection part 241. The first fastening part 251 of the auxiliary diaphragm 25 is fixedly connected to the first connection part 241 of the corresponding flexible circuit board 24. The second fastening part 253 is fixedly connected to the third connection part 243 of the corresponding flexible circuit board 24. A cross-sectional shape of the vibration part of the auxiliary diaphragm 25 is an arc or approximately arc shape, and the vibration part 252 is concave. To be specific, the vibration part 252 protrudes in a direction away from the flexible circuit board 24. When the vibration part 252 of the auxiliary diaphragm 25 subject to an external force, the vibration part 252 can deform, so that the first fastening part 251 and the second fastening part 253 of the auxiliary diaphragm 25 move relative to each other.

Figure 8:
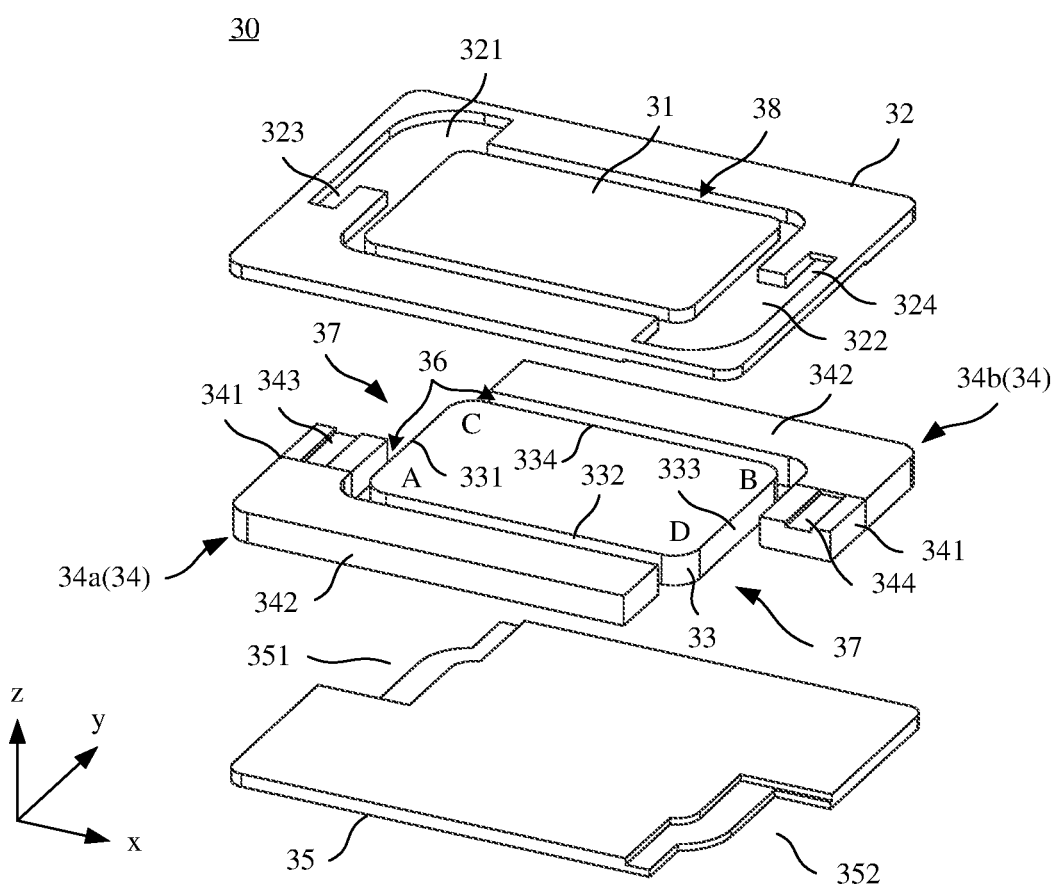
FIG. 8 is a partial schematic exploded view of a magnetic circuit assembly of the electroacoustic transducer shown in FIG. 4.

FIG. 8 is a partial schematic exploded view of a magnetic circuit assembly of the electroacoustic transducer shown in FIG. 4. The magnetic circuit assembly 30 of the electroacoustic transducer includes a central electrode plate 31, a side electrode plate 32, a central magnet 33, two side magnets 34, and a lower electrode plate 35. The central electrode plate 31, the side electrode plate 32, and the lower electrode plate 35 are magnetic conductors, and the central magnet 33 and the two side magnets 34 are permanent magnets.

During specific implementation, the central magnet 33 and the two side magnets 34 are separately disposed on a top surface of the lower electrode plate 35, and each magnet may be fastened to the top surface of the lower electrode plate 35 by bonding. The central magnet 33 is roughly of a rectangular structure. For example, the central magnet 33 may be of a rounded rectangular structure. The central magnet 33 includes four side surfaces and four corner parts, and one corner part is connected between two adjacent side surfaces. The two side magnets 34 are centrosymmetrically disposed on an outer peripheral side of the central magnet 33, and first gaps 36 are formed between the two side magnets 34 and the central magnet 33. For example, the two side magnets 34 may be respectively disposed around two corner parts that are of the central magnet 33 and that are diagonally disposed.

The side magnet 34 includes a first branch 341 disposed in a first direction (that is, the width direction y of the electroacoustic transducer) and a second branch 342 disposed in a second direction (that is, the length direction x of the electroacoustic transducer). In other words, the side magnet 34 is disposed roughly in an L shape. During specific implementation, for the side magnet 34a located on a left side of the central magnet 33, the first branch 341 of the side magnet 34a is located on an outer side of the first side surface 331 of the central magnet 33, and the second branch 342 of the side magnet 34a is located on an outer side of the second side surface 332 of the central magnet 33. In other words, the side magnet 34a is disposed around a first corner part A between the first side surface 331 and the second side surface 332. For the side magnet 34b located on a right side of the central magnet 33, the first branch 341 of the side magnet 34b is located on an outer side of the third side surface 333 of the central magnet 33, and the second branch 342 of the side magnet 34b is located on an outer side of the fourth side surface 334 of the central magnet 33. In other words, the side magnet 34b is disposed around a second corner part B between the third side surface 333 and the fourth side surface 334. When the central magnet 33 is of a rounded rectangular structure, a corner at a connection location between the first branch 341 and the second branch 342 is also a rounded corner, and the rounded corner is coaxially disposed with a corresponding corner part of the central magnet 33. In this way, a shape of an outer peripheral surface of the side magnet 34 can better match that of the central magnet 33, so that a magnetic field with uniform strength can be formed in the first gap 36 between the side magnet 34 and the central magnet 33. It may be understood that the first side surface 331 and the third side surface 333 of the central magnet 33 are respectively side surfaces disposed in a y-axis direction, and the second side surface 332 and the fourth side surface 334 of the central magnet 33 are respectively side surfaces disposed in an x-axis direction.

In addition, on the first side surface 331 of the central magnet 33, the corresponding first branch 341 extends to a location between the first corner part A and a third corner part C, for example, a location close to a middle region of the first side surface 331. On the fourth side surface 334 of the central magnet 33, the corresponding second branch 342 approximately extends to an end that is of the fourth side surface 334 and that is close to the third corner part C. The third corner part C of the central magnet 33 is a corner part between the first side surface 331 and the fourth side surface 334. Similarly, on the third side surface 333 of the central magnet 33, the corresponding first branch 341 extends to a location between the second corner part B and a fourth corner part D, for example, a location close to a middle region of the third side surface 333. On the second side surface 332 of the central magnet 33, the corresponding second branch 342 approximately extends to an end close to the fourth corner part D. The fourth corner part D of the central magnet 33 is a corner part between the second side surface 332 and the third side surface 333. In this way, connection spaces 37 are respectively formed on outer sides of the third corner part C and the fourth corner part D of the central magnet 33, and each connection space 37 separately connects the first gaps 36 between the two magnets 34 on left and right sides and the central magnet 33, and is connected to an outer side of the magnetic circuit assembly 30.

Still refer to FIG. 8. The central electrode plate 31 is located on a side that is of the central magnet 33 and that is away from the lower electrode plate 35, and the central electrode plate 31 may be specifically fastened to the central magnet 33 by bonding. The side electrode plate 32 is located on a side that is of the two side magnets 34 and that is away from the lower electrode plate 35. Similarly, the side electrode plate 32 may be fastened to the side magnets 34 by bonding. During specific implementation, the side electrode plate 32 is roughly of a frame structure, and the side electrode plate 32 is disposed around the central electrode plate 31. A second gap 38 exists between the side electrode plate 32 and the central electrode plate 31. The second gap 38 is connected to the first gap 36. On an inner side that is of the side electrode plate 32 and that faces the central electrode plate 31, a first notch 321 and a second notch 322 are respectively disposed at locations that are of the side electrode plate 32 and that correspond to the two connection spaces 37, to connect each connection space 37 to an outer side of the magnetic circuit assembly 30 in a positive direction of a z-axis. This increases a size of the connection space 37 in the z-axis direction.

In addition, notches may be disposed at locations that are of the lower electrode plate 35 and that correspond to the two connection spaces 37, which are respectively a third notch 351 and a fourth notch 352. The third notch 352 and the fourth notch 352 may connect each connection space 37 to an outer side of the magnetic circuit assembly 30 in a negative direction of the z-axis, to increase the size of the connection space 37 in the z-axis direction.

Figure 9:
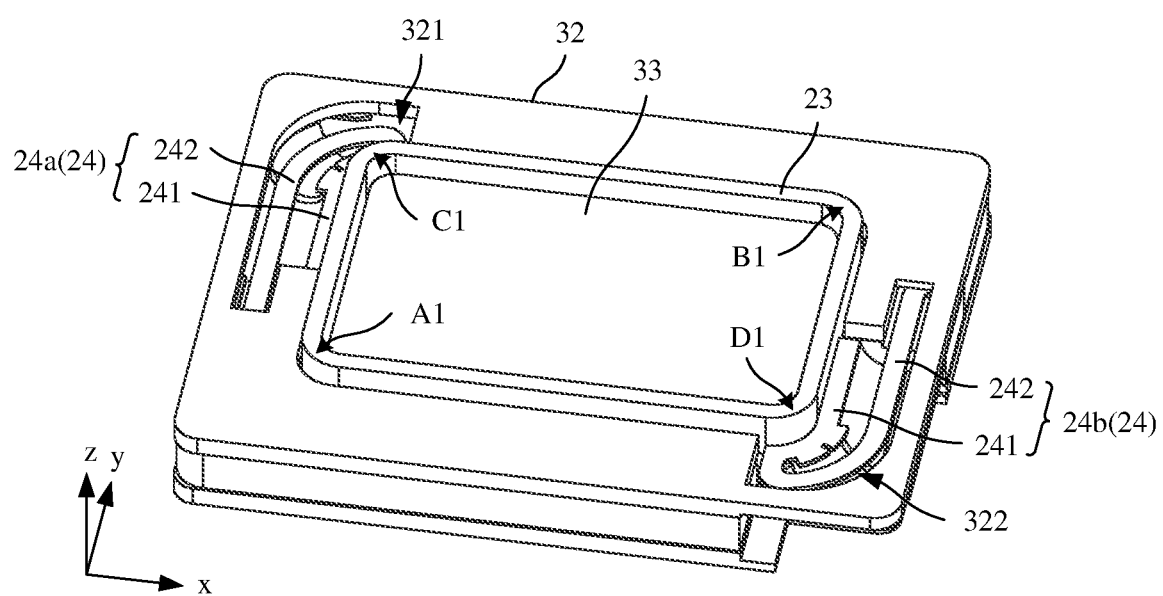
FIG. 9 is a schematic diagram of a partial structure of the electroacoustic transducer shown in FIG. 4.
Figure 10:
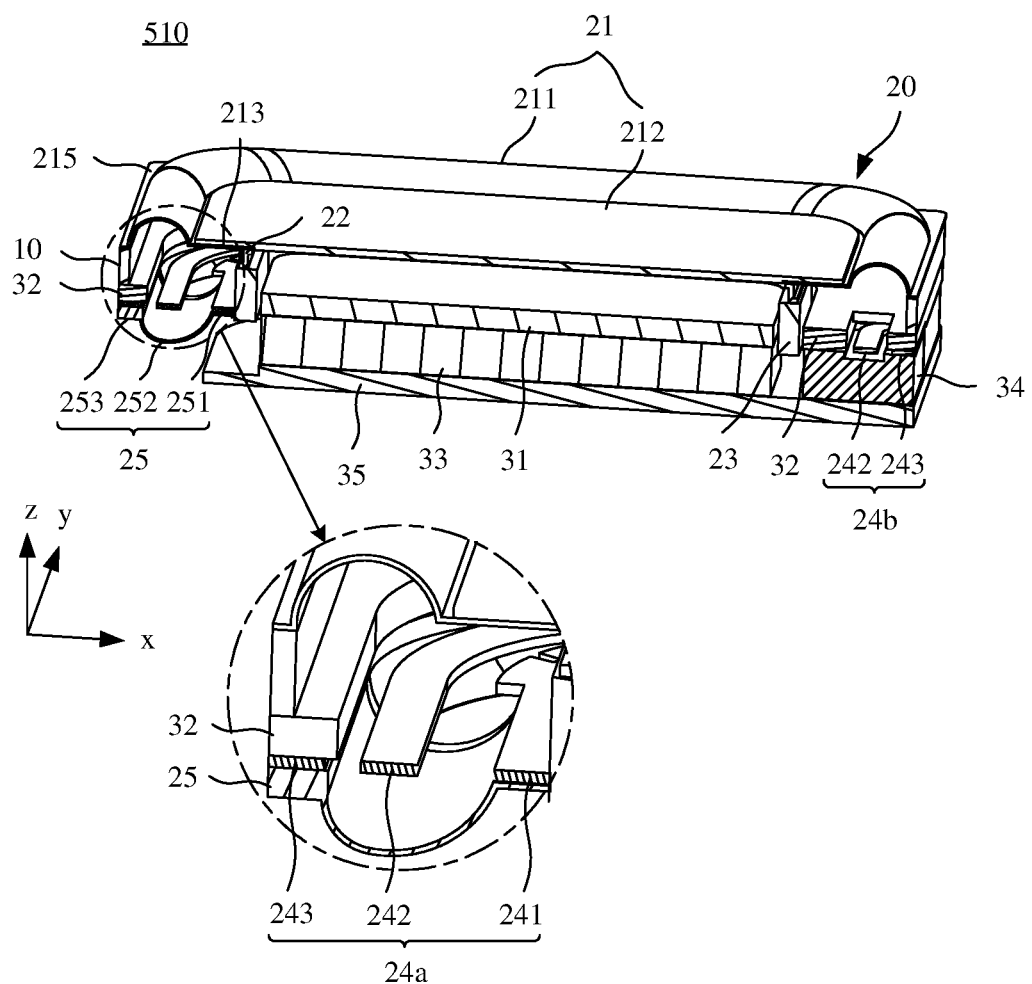
FIG. 10 is a sectional view of the electroacoustic transducer shown in FIG. 4 in an A-A direction.

Refer to FIG. 8 to FIG. 10. FIG. 9 is a schematic diagram of a partial structure of the electroacoustic transducer shown in FIG. 4. FIG. 10 is a sectional view of the electroacoustic transducer shown in FIG. 4 in an A-A direction. After the vibration assembly 20, the frame 10, and the magnetic circuit assembly 30 are assembled, a peripheral of the sound diaphragm 21 is fastened to a first surface of the frame 10. For example, the second fastening part 211 of the sound diaphragm 21 may be fastened to the frame 10 by bonding. A vibration direction of the sound diaphragm 21 is parallel to the thickness direction z of the electroacoustic transducer 510. The voice coil 23 is located inside the frame 10, and an end of the voice coil 23 is fixedly connected to the sound diaphragm 21. For example, the voice coil 23 is fixedly connected to the first fastening part 213 of the sound diaphragm 21 through the connection frame 22.

The central magnet 33 and the two side magnets 34 are fastened to a side that is of the lower electrode piece 35 and that faces the frame body 10. One side magnet 34a is disposed around the first corner part A of the central magnet 33, and the other side magnet 34b is disposed around the second corner part B of the central magnet 33. An end that is of the voice coil 23 and that is away from the sound diaphragm 21 is partially inserted into the first gap 36 formed by the central magnet 33 and the side magnet 34.

An edge of a surface that is of the side electrode plate 32 and that faces the sound diaphragm 21 is fixedly connected to a second surface of the frame 10, and a surface that is of the side electrode plate 32 and that is opposite to the sound diaphragm 21 is fixedly connected to the two side magnets 34. The central electrode plate 31 is located inside the side electrode plate 32, and the central electrode plate 31 is fastened to a surface that is of the central magnet 33 and that faces the sound diaphragm 21. The end that is of the voice coil 23 and that is away from the sound diaphragm 21 is sequentially inserted into the second gap 38 and the first gap 36 in the negative direction of the z-axis.

The two flexible circuit boards 24 are located on a side that is of the side electrode plate 32 and that is away from the frame 10, and the two flexible circuit boards 24 are respectively disposed near the two diagonally disposed corner parts of the voice coil 23. For example, the first connection part 241 of the flexible circuit board 24a is fixedly connected to an end that is of an outer peripheral surface of a third corner C1 of the voice coil 23 and that is away from the sound diaphragm 21, and the third connection part 243 of the flexible circuit board 24a is fixedly connected to an edge of a surface that is of the side electrode plate 32 and that is away from the frame 10. The first connection part 241 of the flexible circuit board 24b is fixedly connected to an end that is of an outer peripheral surface of a fourth corner D1 of the voice coil 23 and that is away from the sound diaphragm 21, and the third connection part 243 of the flexible circuit board 24b is fixedly connected to an edge of a surface that is of the side electrode plate 32 and that is away from the frame 10. On a surface that is of the side electrode plate 32 and that faces the frame 10, the first notch 321 of the side electrode plate 32 may expose the first connection part 241 and the second connection part 242 of the flexible circuit board 24a, and the second notch 322 of the side electrode plate 32 may expose the first connection part 241 and the second connection part 242 of the flexible circuit board 24b. In other words, on an xy plane, the two side magnets 34 and the two flexible circuit boards 24 are approximately disposed in a staggered manner, the two side magnets 34 occupy outer peripheral regions of one pair of corners (that is, a first corner A1 and a second corner B1 of the voice coil) of the voice coil 23, and the two flexible circuit boards 24 occupy outer peripheral regions of the other pair of corners (that is, the third corner C1 and the fourth corner D1 of the voice coil) of the voice coil 23.

It should be noted that, in the foregoing solution, the voice coil 23 is disposed around an outer peripheral side of the central magnet 33, and the first corner A1, the second corner B1, the third corner C1, and the fourth corner D1 of the voice coil 23 respectively correspond to the first corner part A, the second corner part B, the third corner part C, and the fourth corner part D of the central magnet 33.

The two auxiliary diaphragms 25 are separately fastened on a surface that is of the two flexible circuit boards 24 and that is away from the side electrode plate 32. The first fastening part 251 of the auxiliary diaphragm 25 is fixedly connected to the first connection part 241 of the corresponding flexible circuit board 24. The second fastening part 253 is fixedly connected to the third connection part 243 of the corresponding flexible circuit board 24. The vibration part 252 of the auxiliary diaphragm 25 and the second connection part 242 of the corresponding flexible circuit board 24 are at opposite positions. In this case, the two auxiliary diaphragms 25 are respectively located in the two connection spaces 37 of the magnetic circuit assembly 30.

In addition, in this embodiment, the flexible circuit board 24 and the side magnet 34 may have an overlapping region in the z-axis direction, to ensure that the side magnet 34 has a large size, and also increase a length of the flexible circuit board 24, so that magnetic induction intensity of the magnetic circuit assembly 30 and vibration performance of the vibration assembly are improved. During specific implementation, in a negative direction of the y-axis, the straight line segment of the second connection part 242 of the flexible circuit board 24a exceeds the straight line segment of the first connection part 241. In other words, relative to the head end of the first connection part 241, the tail end of the second connection part 242 is disposed closer to the first corner part A1 of the voice coil 23. On the outer side of the first side surface 331 of the central magnet 33, a first avoidance groove 343 is disposed on a surface that is of the first branch 341 and that faces the side electrode plate 32. The tail end of the second connection part 242 of the flexible circuit board 24a may extend above the first branch 341, and is disposed opposite to the first avoidance groove 343. In addition, a first avoidance hole 323 is disposed at a location that is of the side electrode plate 32 and that corresponds to the first avoidance groove 343, and the first avoidance hole 323 is connected to the first notch 321. In this way, when the voice coil 23 drives the flexible circuit board 24a to vibrate in the z direction, the first avoidance groove 343 and the first avoidance hole 323 may provide avoidance space for movement of the second connection part 242, to avoid interference caused by the first branch 341 and the side electrode plate 32 to movement of the second connection part 242, and improve vibration performance of the vibration assembly 30.

Similarly, in a positive direction of the y-axis, the straight line segment of the second connection part 242 of the flexible circuit board 24b exceeds the straight line segment of the first connection part 241. In other words, relative to the head end of the first connection part 241, the tail end of the second connection part 242 is disposed closer to the second corner part B1 of the voice coil. On the outer side of the third side surface 333 of the central magnet 33, a second avoidance groove 344 is disposed on a surface that is of the first branch 341 and that faces the side electrode plate 32. The tail end of the second connection part 242 of the flexible circuit board 24b may extend above the first branch 341, and is disposed opposite to the second avoidance groove 344. A second avoidance hole 324 is disposed at a location that is of the side electrode plate 32 and that corresponds to the second avoidance groove 344, and the second avoidance hole 324 is connected to the second notch 322. In this way, when the voice coil 23 drives the flexible circuit board 24b to vibrate in the z direction, the second avoidance groove 344 and the second avoidance hole 324 may provide avoidance space for movement of the second connection part 242, to avoid interference caused by the first branch 341 and the side electrode plate 32 to movement of the second connection part 242, and improve vibration performance of the vibration assembly 30.

It should be noted that, to reduce difficulty of a manufacturing process of the side magnet 34, in some implementations, a part that is of the first branch 341 and that is provided with the first avoidance groove 343 (a third avoidance groove 344) and a remaining part of the side magnet 34 may be separately formed, and then fixedly connected by bonding or the like.

Figure 11:
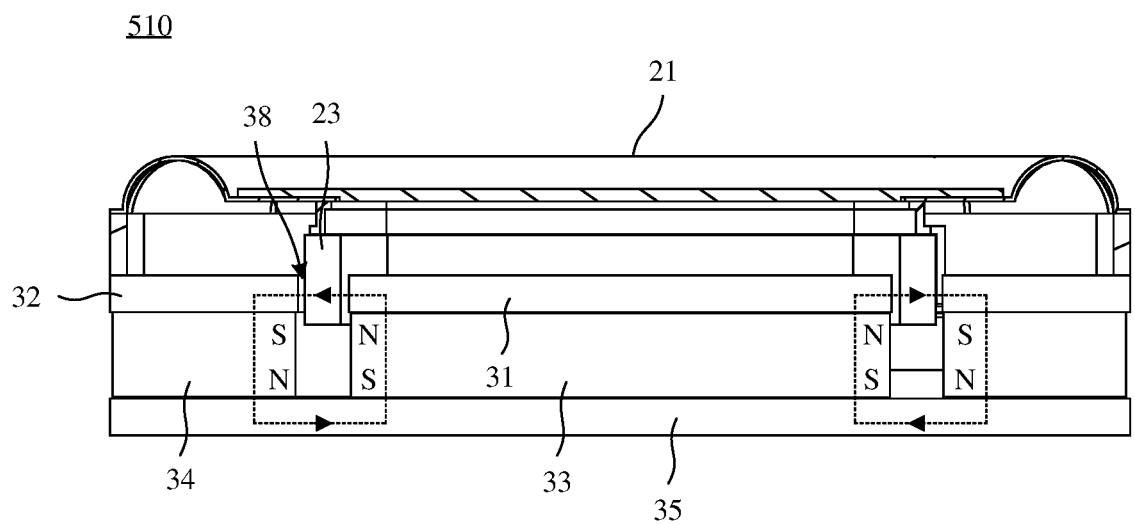
FIG. 11 is a sectional view of the electroacoustic transducer shown in FIG. 4 in a B-B direction.

FIG. 11 is a sectional view of the electroacoustic transducer shown in FIG. 4 in a B-B direction. For example, an end that is of the central magnet 33 and that is close to the central electrode plate 31 is an N pole, and an end that is of the central magnet 33 and that is close to the lower electrode plate 35 is an S pole. An end that is of the side magnet 34 and that is close to the side electrode plate 32 is an S pole, and an end that is of the side magnet 34 and that is close to the lower electrode plate 35 is an N pole. A path of a magnetic line (shown by a dashed line in FIG. 11) is "the N pole of the central magnet 33—the central electrode plate 31—the second gap 38—the side electrode plate 32—the S pole of the side magnet 34—the N pole of the side magnet 34—the lower electrode plate 35—the S pole of the central magnet 33". The voice coil 23 is partially located in the second gap 38, and the magnetic circuit assembly forms a magnetic field in the second gap 36. Therefore, when the voice coil 23 is powered on, an ampere force in the z-axis direction may be generated, to drive the voice coil 23 and the sound diaphragm 21 connected to the voice coil 23 to vibrate. During vibration, the sound diaphragm 21 pushes air in front (that is, in the positive direction of the z axis) of the sound diaphragm 21 to generate a sound wave, so that the electroacoustic transducer 510 emits a sound.

In addition, when the voice coil 23 vibrates, the first connection part 241 and the second connection part 242 of the flexible circuit board 24a vibrate in the z-axis direction in the first notch 321 and the corresponding connection space 37, and amplitudes gradually decrease from the head end of the first connection part 241 to the tail end of the second connection part 242. The third connection part 243 of the flexible circuit board 24a is fastened to an edge of the side electrode plate 32, and does not vibrate with the voice coil 23. The auxiliary diaphragm 25 vibrates in the z-axis direction in the connection space 37 below the first notch 321. The first connection part 241 and the second connection part 242 of the flexible circuit board 24b vibrate in the z-axis direction in the second notch 322 and the corresponding connection space 37, and amplitudes gradually decrease from the head end of the first connection part 241 to the tail end of the second connection part 242. The third connection part 243 of the flexible circuit board 24b is fastened to an edge of the side electrode plate 32, and does not vibrate with the voice coil 23. The auxiliary diaphragm 25 vibrates in the z-axis direction in the connection space 37 below the second notch 322.

In this embodiment, the sound diaphragm 21 located above the voice coil 23 may form a first compliant system of the electroacoustic transducer 510, and the flexible circuit board 24 and the auxiliary diaphragm 25 located below the voice coil 23 may form a second compliant system of the electroacoustic transducer 510. When the two compliant systems vibrate with the voice coil 23, rolling vibration of the voice coil 23 can be suppressed, and the electroacoustic transducer 510 can obtain better sound quality. A compliance coefficient of the compliant system is a reciprocal of an elasticity coefficient, and a component with a higher compliance coefficient is more likely to deform under a force.

For example, in the two compliant systems, the sound diaphragm 21 has high hardness and low compliance, so that the sound diaphragm 21 can smoothly push air to emit a sound. The flexible circuit board 24 and the auxiliary diaphragm 25 have low hardness and high compliance, so that total hardness of the two compliant systems is appropriate, to ensure working reliability of the electroacoustic transducer 510. In addition, during specific design, hardness of the auxiliary diaphragm 25 may be greater than hardness of the flexible circuit board 24, so that the second compliant system has higher stability, to better suppress swinging of the voice coil 23, and reduce a rolling amplitude of the voice coil 23.

Compared with a conventional electroacoustic transducer in which a side magnet is arranged on a side surface of a central magnet, in the electroacoustic transducer in this embodiment, the side magnet is designed as an L-shaped structure, so that the two side magnets are disposed around the two diagonally arranged corner parts of the central magnet, to fill a magnet loss on outer peripheral sides of the two corner parts, and increase an overall size of the side magnets by at least 20%. Therefore, magnetic induction intensity of the magnetic circuit assembly can be effectively improved, and a driving capability of the magnetic circuit assembly is improved, so that the electroacoustic transducer has better sensitivity. It is verified that sensitivity of the electroacoustic transducer provided in this embodiment can be improved by more than 1 dB.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electroacoustic transducer, comprising a central magnet, two side magnets, a lower electrode plate, a side electrode plate, a frame, a sound diaphragm, a voice coil, and two flexible circuit boards, wherein
    the central magnet and the two side magnets are separately disposed on a surface of the lower electrode plate, the central magnet is of a rectangular structure, and comprises a first corner part and a second corner part that are diagonally disposed, and a third corner part and a fourth corner part that are diagonally disposed, the two side magnets are disposed centrosymmetrically around the first corner part and the second corner part respectively, and a first gap exists between the two side magnets and the central magnet;
    the side electrode plate is disposed on surfaces of the two side magnets that are opposite to surfaces of the two side magnets that face the lower electrode plate;
    one surface of the frame is fixedly connected to a side that is of the side electrode plate and that is opposite to a side of the side electrode plate that faces the lower electrode plate, and another surface of the frame is fixedly connected to a periphery of the sound diaphragm;
    the voice coil is located inside the frame, the voice coil is of a rectangular ring structure, one end of the voice coil is fixedly connected to the sound diaphragm, and another end of the voice coil is inserted into the first gap; and
    the two flexible circuit boards are symmetrically distributed on peripheral sides of the voice coil, and each flexible circuit board is fixedly connected to the side electrode plate;
    the voice coil comprises a third corner and a fourth corner that correspond to the third corner part and the fourth corner part respectively; and
    the two flexible circuit boards are respectively disposed on outer peripheral sides of the third corner and the fourth corner, one end of each flexible circuit board is fixedly connected to the voice coil, and another end of each flexible circuit board is fixedly connected to a surface of the side electrode plate that faces the lower electrode plate.

2. The electroacoustic transducer according to claim 1, wherein the central magnet comprises a first side surface and a second side surface that are adjacent to the first corner part, and a third side surface and a fourth side surface that are adjacent to the second corner part; and
    each side magnet of the two side magnets comprises a first branch and a second branch that are connected to form an L-shaped structure, the first branch and the second branch of a first side magnet of the two side magnets are respectively located on outer sides of the first side surface and the second side surface, and the first branch and the second branch of a second side magnet of the two side magnets are respectively located on outer sides of the third side surface and the fourth side surface.

3. The electroacoustic transducer according to claim 2, wherein and the first branch of the first side magnet extends between the first corner part and the third corner part, and the second branch of the first side magnet extends to an end that is of the second side surface and that is adjacent to the fourth corner part; and the first branch of the second side magnet extends between the second corner part and the fourth corner part, and the second branch of the second side magnet extends to an end that is of the fourth side surface and that is adjacent to the third corner part.

4. The electroacoustic transducer according to claim 3, wherein each of the two flexible circuit boards comprises a first connection part, a second connection part, and a third connection part that are sequentially connected, each first connection part is fixedly connected to the voice coil, each second connection part is located on a side that is of the corresponding first connection part and that is opposite to a side of the corresponding first connection part that faces the voice coil, each third connection part is located on a side that is of the second connection part and that is opposite to a side of the corresponding second connection part that faces the first connection part, and each third connection part is fixedly connected to the side electrode plate; and the side electrode plate is provided with a first notch and a second notch that are symmetrically distributed, and the first notch and the second notch respectively expose first connection parts and a part of second connection parts of the two flexible circuit boards.

5. The electroacoustic transducer according to claim 4, wherein for each flexible circuit board, an end that is of the corresponding second connection part and that is connected to the corresponding third connection part is stacked on a surface that is of a closest first branch and that is opposite to a surface of the closest first branch that faces the lower electrode plate, and the second connection parts of the two flexible circuit boards respectively extend on an outer peripheral side of the first side surface and an outer peripheral side of the third side surface, and an avoidance groove is disposed at a location that is on the closest first branch and that corresponds to an end part of the corresponding second connection part.

6. The electroacoustic transducer according to claim 5, wherein avoidance holes are respectively disposed at locations that are of the side electrode plate and that correspond to two avoidance grooves, and the avoidance holes are connected to the first notch and the second notch respectively.

7. The electroacoustic transducer according to claim 4, wherein the electroacoustic transducer further comprises two auxiliary diaphragms, the two auxiliary diaphragms are respectively disposed on sides that are of the two flexible circuit boards and that face the sound diaphragm, one end of each auxiliary diaphragm is fixedly connected to the first connection part of a corresponding flexible circuit board, and the other end of the each auxiliary diaphragm is fixedly connected to the third connection part of the corresponding flexible circuit board.

8. The electroacoustic transducer according to claim 7, wherein the sound diaphragm comprises a first vibration part, a cross-sectional shape of the first vibration part of the sound diaphragm is an arc shape, and the first vibration part of the sound diaphragm protrudes in a direction opposite to the lower electrode plate; and
each auxiliary diaphragm comprises a second vibration part, a cross-sectional shape of each second vibration part of the each auxiliary diaphragm is an arc shape, and the second vibration part of the each auxiliary diaphragm protrudes in a direction facing the lower electrode plate.

9. The electroacoustic transducer according to claim 7, wherein a third notch and a fourth notch are respectively disposed at locations that are of the lower electrode plate and that correspond to the two auxiliary diaphragms.

10. The electroacoustic transducer according to claim 1, wherein the electroacoustic transducer further comprises a connection frame, the connection frame is located between the voice coil and the sound diaphragm, one end of the connection frame is fixedly connected to the voice coil, and another end of the connection frame is fixedly connected to the sound diaphragm.

11. An electronic device, comprising a housing, a display module, and a receiver, wherein the receiver is disposed in the housing, wherein
the display module comprises a glass cover and a display panel, the glass cover is fastened to the housing, and the display panel is fastened to an inner surface that is of the glass cover and that faces the housing;
a receiver hole is disposed on the glass cover, or a receiver hole is formed between an edge of the glass cover and the housing, or a receiver hole is disposed on the housing; and
the receiver comprises a central magnet, two side magnets, a lower electrode plate, a side electrode plate, a frame, a sound diaphragm, a voice coil, and two flexible circuit boards, wherein
the central magnet and the two side magnets are separately disposed on a surface of the lower electrode plate, the central magnet is of a rectangular structure, and comprises a first corner part and a second corner part that are diagonally disposed, and a third corner part and a fourth corner part that are diagonally disposed, the two side magnets are disposed centrosymmetrically around the first corner part and the second corner part respectively, and a first gap exists between the two side magnets and the central magnet;
the side electrode plate is disposed on surfaces that are of the two side magnets and that are opposite to surfaces of the two side magnets that face the lower electrode plate;
one surface of the frame is fixedly connected to a side that is of the side electrode plate and that is opposite to a side of the side electrode plate that faces the lower electrode plate, and another surface of the frame is fixedly connected to a periphery of the sound diaphragm;
the voice coil is located inside the frame, the voice coil is of a rectangular ring structure, one end of the voice coil is fixedly connected to the sound diaphragm, and another end of the voice coil is inserted into the first gap; and
the two flexible circuit boards are symmetrically distributed on a peripheral side of the voice coil, and each flexible circuit board is fixedly connected to the side electrode plate, and a sound emitted by the receiver is transmitted to an outer side of the electronic device through the receiver hole;
the voice coil comprises a third corner and a fourth corner that correspond to the third corner part and the fourth corner part respectively; and
the two flexible circuit boards are respectively disposed on outer peripheral sides of the third corner and the fourth corner, one end of each flexible circuit board is fixedly connected to the voice coil, and another end of each flexible circuit board is fixedly connected to a surface of the side electrode plate that faces the lower electrode plate.

12. The electronic device according to claim 11, wherein the central magnet comprises a first side surface and a second side surface that are adjacent to the first corner part, and a third side surface and a fourth side surface that are adjacent to the second corner part; and
each side magnet of the two side magnets comprises a first branch and a second branch that are connected to form an L-shaped structure, the first branch and the second branch of a first side magnet of the two side magnets are respectively located on outer sides of the first side surface and the second side surface, and the first branch and the second branch of a second side magnet of the two side magnets are respectively located on outer sides of the third side surface and the fourth side surface.

13. The electronic device according to claim 12, wherein the first branch of the first side magnet extends between the first corner part and the third corner part, and the second branch of the first side magnet extends to an end that is of the second side surface and that is adjacent to the fourth corner part; and the first branch of the second side magnet extends between the second corner part and the fourth corner part, and the second branch of the second side magnet extends to an end that is of the fourth side surface and that is adjacent to the third corner part.

14. The electronic device according to claim 13, wherein each of the two flexible circuit boards comprises a first connection part, a second connection part, and a third connection part that are sequentially connected, each first connection part is fixedly connected to the voice coil, each second connection part is located on a side that is of the corresponding first connection part and that is opposite to a side of the corresponding first connection part that faces the voice coil, each third connection part is located on a side that is of the corresponding second connection part and that is opposite to a side of the corresponding second connection part that faces the first connection part, and each third connection part is fixedly connected to the side electrode plate; and the side electrode plate is provided with a first notch and a second notch that are symmetrically distributed, and the first notch and the second notch respectively expose first connection parts and a part of second connection parts of the two flexible circuit boards.

15. The electronic device according to claim 14, wherein for each flexible circuit board, an end that is of the corresponding second connection part and that is connected to the corresponding third connection part is stacked on a surface that is of closest first branch and that is opposite to a surface of the closest first branch that faces the lower electrode plate, and the second connection parts of the two flexible circuit boards respectively extend on an outer peripheral side of the first side surface and an outer peripheral side of the third side surface, and an avoidance groove is disposed at a location that is on the closest first branch and that corresponds to an end part of the corresponding second connection part.

16. The electronic device according to claim 15, wherein avoidance holes are respectively disposed at locations that are of the side electrode plate and that correspond to two avoidance grooves, and two avoidance holes are connected to the first notch and the second notch respectively.

17. The electronic device according to claim 14, wherein the receiver further comprises two auxiliary diaphragms, the two auxiliary diaphragms are respectively disposed on sides that are of the two flexible circuit boards and that face the sound diaphragm, one end of each auxiliary diaphragm is fixedly connected to the first connection part of a corresponding flexible circuit board, and another end of the each auxiliary diaphragm is fixedly connected to the third connection part of the corresponding flexible circuit board.

18. The electronic device according to claim 17, wherein the sound diaphragm comprises a first vibration part, a cross-sectional shape of the first vibration part of the sound diaphragm is an arc shape, and the first vibration part of the sound diaphragm protrudes in a direction opposite to the lower electrode plate; and each auxiliary diaphragm comprises a second vibration part, a cross-sectional shape of each second vibration part of the each auxiliary diaphragm is an arc shape, and the second vibration part of the each auxiliary diaphragm protrudes in a direction facing the lower electrode plate.

19. The electroacoustic transducer according to claim 1, further comprising:

a central electrode plate over the central magnet, wherein the side electrode plate encircles the central electrode plate.

20. The electronic device according to claim 11, wherein the receiver further comprises:

a central electrode plate over the central magnet, wherein the side electrode plate encircles the central electrode plate.

\* \* \* \* \*